United States Patent [19]

Hernandez et al.

[11] Patent Number: 5,676,301

[45] Date of Patent: Oct. 14, 1997

[54] CASTELLATED NOZZLE AND METHOD OF USE THEREOF

[75] Inventors: Bernie Hernandez, Norwack, Conn.; Raymond R. Horton, Dover Plains; Michael J. Palmer, Walden, both of N.Y.; Frederick G. Weindelmayer, Manassas, Va.

[73] Assignee: International Business Machines Corporation, Armonk, N.Y.

[21] Appl. No.: 733,835

[22] Filed: Oct. 18, 1996

Related U.S. Application Data

[62] Division of Ser. No. 388,327, Feb. 14, 1995, Pat. No. 5,593,083.

[51] Int. Cl.⁶ .............................. H05K 3/34; B23K 3/04
[52] U.S. Cl. .............................. 228/44.7; 228/42
[58] Field of Search .................... 228/20.1, 42, 44.7, 228/51–53; 219/56, 56.1, 229, 230

[56] References Cited

U.S. PATENT DOCUMENTS

| | | | |
|---|---|---|---|
| 3,382,564 | 5/1968 | Gallentine | 219/230 |
| 3,746,239 | 7/1973 | Auray | 219/230 |
| 3,957,185 | 5/1976 | Kauffman et al. | 228/44.7 |
| 4,518,110 | 5/1985 | Breske et al. | 228/51 |
| 4,610,388 | 9/1986 | Koltuniak et al. | 228/6.2 |
| 4,620,659 | 11/1986 | Holdway | 228/20 |
| 4,626,205 | 12/1986 | Barkley et al. | 432/225 |
| 4,817,851 | 4/1989 | Kolesar et al. | 228/119 |
| 4,937,006 | 6/1990 | Bickford et al. | 228/20.1 |
| 4,971,554 | 11/1990 | Moore | 432/19 |
| 4,972,990 | 11/1990 | Abbagnaro et al. | 228/20 |
| 5,042,571 | 8/1991 | Drislane | 165/58 |
| 5,048,747 | 9/1991 | Clark et al. | 228/180.21 |
| 5,054,106 | 10/1991 | Fortune | 392/476 |
| 5,057,969 | 10/1991 | Ameen et al. | 361/386 |
| 5,115,964 | 5/1992 | Ameen et al. | 228/180.2 |
| 5,205,461 | 4/1993 | Bickford et al. | 228/20.1 |
| 5,222,649 | 6/1993 | Funari et al. | 228/44.7 |
| 5,439,161 | 8/1995 | Kawatani et al. | 228/44.7 |

FOREIGN PATENT DOCUMENTS

| | | | |
|---|---|---|---|
| 147512 | 4/1981 | Germany | 228/44.7 |
| 147636 | 4/1981 | Germany | 228/44.7 |

OTHER PUBLICATIONS

IBM Technical Disclosure Bulletin, "Multipoint Thermocompression Bonder", vol. 11, No. 3, p. 311, Aug. 1968.
IBM Technical Disclosure Bulletin, "Solder Reflow Apparatus", vol. 21, No. 7, pp. 2918–2919, Dec., 1978.

*Primary Examiner*—Samuel M. Heinrich
*Attorney, Agent, or Firm*—Heslin & Rothenberg, P.C.

[57] ABSTRACT

A castellated nozzle for connecting a plurality of microelectronic leads to an associated plurality of contact pads and method of using the same. The castellated nozzle includes a body having a plurality of castellations protruding therefrom, with each of the castellations having a contact surface thereon. A channel is formed adjacent to at least one castellation of the plurality of castellations. An opening extends through the body for introducing a heated gas therein. The contact surfaces of the plurality of castellations are aligned to a respective plurality of leads. Typically, the castellated nozzle includes a first plurality of castellations forming a first row and a second plurality of castellations forming a second row.

21 Claims, 9 Drawing Sheets

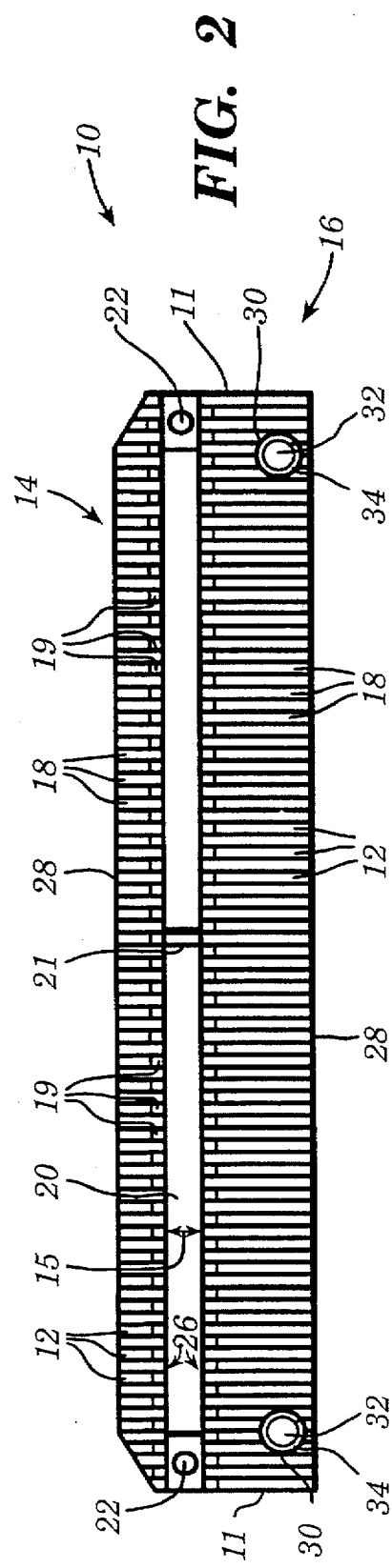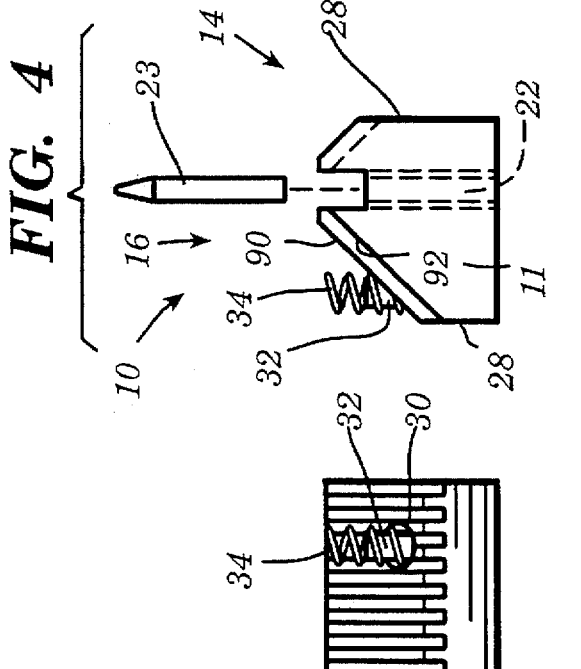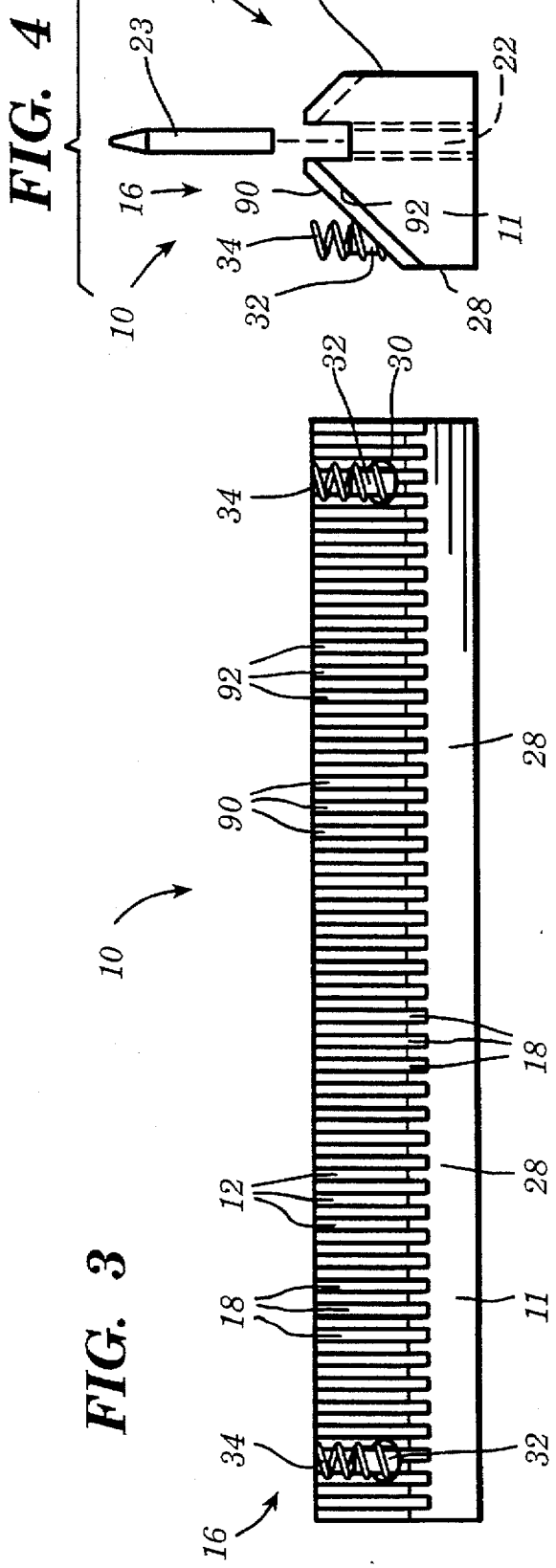

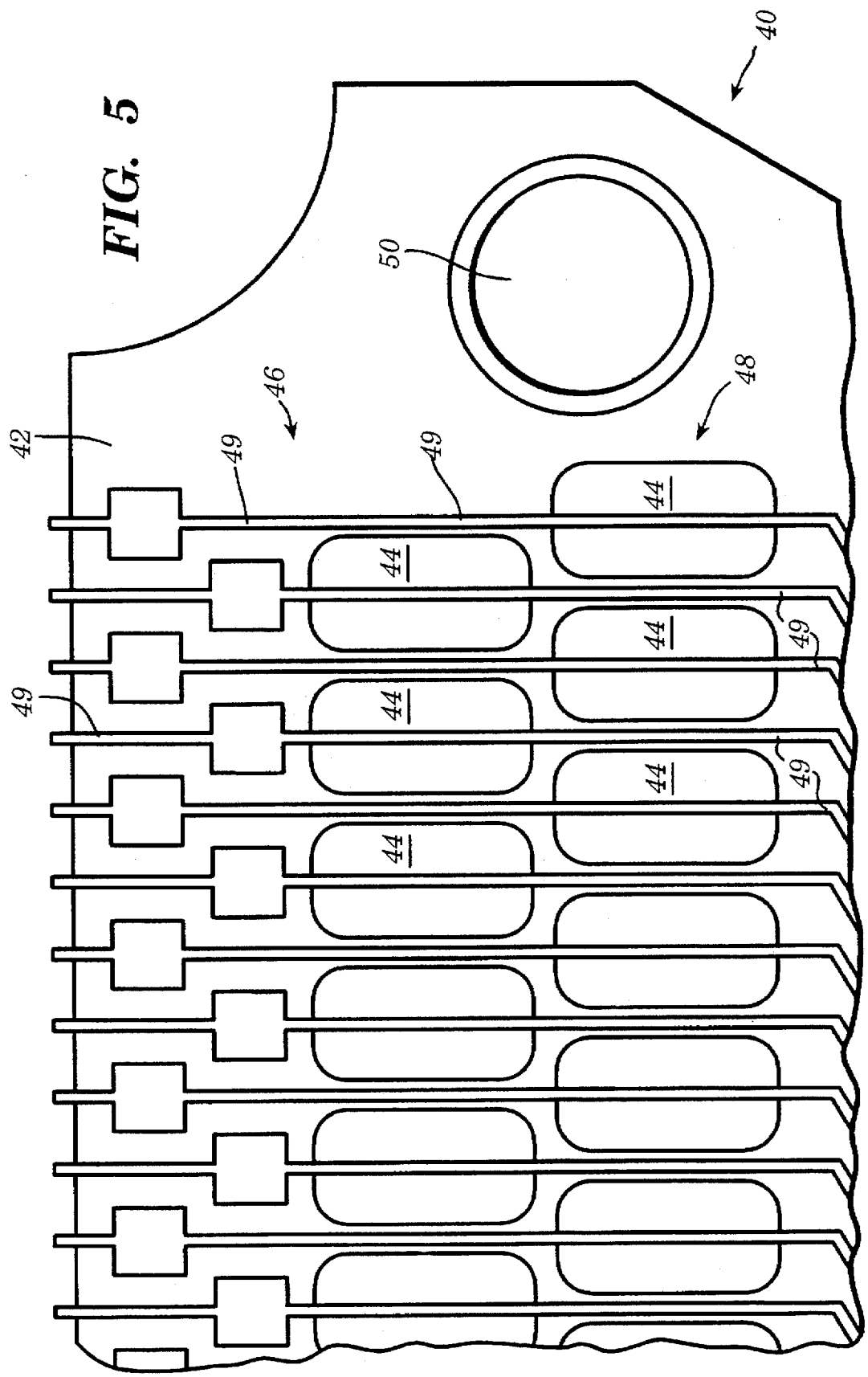

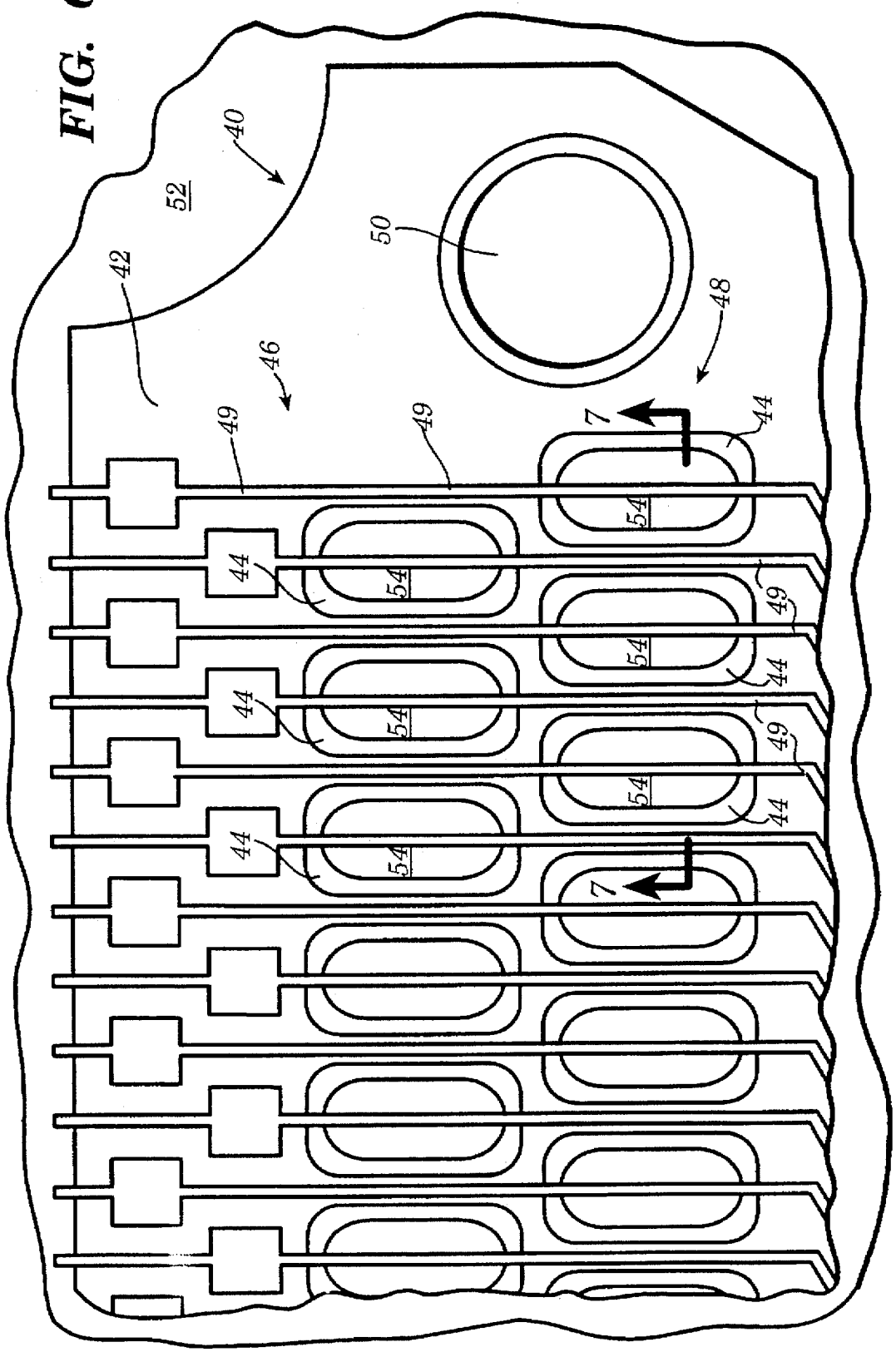

CASTELLATED NOZZLE AND METHOD OF USE THEREOF

This application is a division of application Ser. No. 08/388,327 filed Feb. 14, 1995 which application is now U.S. Pat. No. 5,593,083.

BACKGROUND OF THE INVENTION

1. Technical Field

The present invention generally relates to microelectronic packaging. More particularly, the present invention relates to tools employed to interconnect semiconductor chip packaging structures to semiconductor packaging substrates. Even more particularly, the present invention relates to apparatuses employed to solder bond a plurality of microelectronic leads to their respective contact pads.

2. Background Information

As is well known, soldering represents a common technique employed in numerous joining applications in microelectronics. In accordance with these well-known soldering techniques, flexible circuit carriers are widely used in the design of microelectronic packages to connect various microelectronic packages and devices to one another. For instance, a flexible circuit carrier may be used to interconnect a semiconductor chip packaging structure, such as a multi-chip module, and a semiconductor packaging substrate, such as a printed circuit board.

A problem associated with the design of microelectronic packages is the requirement of providing sound electrical connections between a relatively large number of extremely small conductive leads, i.e., signal, ground, and power conductors, and their respective contact locations. These contact locations, i.e., contact pads, may be applied to a semiconductor chip or other circuit location in a wide variety of configurations. In the microelectronics industry, the precise alignment of a plurality of conductive leads on one semiconductor device to an associated plurality of contact pads on another semiconductor device presents a significant problem. Often, in order to achieve the precise alignment required between the miniature conductive leads and their respective contact pads, sophisticated and expensive alignment systems are necessary. Such systems typically are programmed to achieve extremely close alignment tolerances.

Furthermore, it is often necessary to force the leads, once properly aligned, into contact with their respective contact locations. However, forcing a large plurality of microelectronic conductive leads into contact with a like plurality of contact pads requires a tool which can be precisely aligned so that the leads can be properly displaced to make contact with their associated contact locations. Another device is also needed to heat the contact pads to a temperature sufficient to melt the solid solder thereon so that solder joints can be formed.

As will be disclosed herein, the present invention defines an apparatus and method of using a castellated nozzle for forming sound electrical connections between a semiconductor chip packaging structure, such as a multi-chip module, and a packaging substrate, such as a printed circuit board, without the need for a sophisticated alignment system. These sound electrical connections are achieved notwithstanding the need to force a plurality of leads into contact with their respective contact locations. As will be further defined, such connections can be achieved by soldering. Moreover, the apparatus and method as described herein permits the fluxless solder bonding of conductive leads to their associated contact pads.

The present invention provides a significant improvement over currently known microelectronic soldering devices which effect electrical connections in miniaturized electronic packages and is applicable to tape automated bonding (TAB) technology. The apparatus as defined herein assures Strong electrical connections between extremely small microelectronic circuit elements. The apparatus is relatively simple to use, and can be adapted to mass production techniques, thus reducing the overall cost of the final package structure.

Thus, a need exists for an apparatus which simplifies soldering and connection of a plurality of miniaturized microelectronic elements. The structure and method of use of the present invention contains a solution to the aforementioned problems. As defined below, the present invention provides a significant improvement over currently known soldering techniques for performing electrical connections in miniaturized electronic packages.

SUMMARY OF THE INVENTION

Briefly, the present invention satisfies this need and overcomes the shortcomings of the prior art through the provision of a castellated nozzle for connecting a plurality of leads to a plurality of contact pads, which includes a body having a plurality of castellations protruding therefrom, with each of the castellations having a contact surface thereon. A channel is formed adjacent to at least one castellation of the plurality of castellations. An opening extends through the body of the nozzle for providing a heated gas to the plurality of channels. A means for aligning the contact surfaces of the plurality of castellations to a respective plurality of leads is formed through the body of the castellated nozzle.

The castellations and channels may form a first row and a second row thereof, with the opening separating the first row from the second row. The opening may define a first inner wall opposing a second inner wall. Both walls may be substantially parallel to one another. The first and second inner walls may form an inner edge of the castellations and channels. The opening which extends through the body of the nozzle may have a bottom open end and a top open end.

The contact surface of each castellation may include an outer edge. A planar surface may extend from the outer edge of the contact surface to an outer wall of the castellated nozzle body. At the outer edge of each castellation, the contact surface may intersect the planar surface. Also, each of the channels may form a channel surface extending from its inner edge to the outer wall of the castellated nozzle body.

Typically, the plurality of leads are located on a flexible circuit carrier. A plurality of apertures are formed on the flexible circuit carrier in the same configuration as the plurality of castellations. Each one of the plurality of conductive leads has a portion which bridges a respective aperture of the plurality of apertures.

The present invention will typically include a substrate having a plurality of contact pads deposited thereon in the same configuration as the plurality of apertures. Both the flexible circuit carrier and the substrate preferably have a means for alignment with one another and to the castellated nozzle.

In order to effect operation of the castellated nozzle of the present invention, the flexible circuit carrier is aligned and mated with the substrate so that each of the plurality of contact pads is positioned proximate to a respective aperture of the plurality of apertures. Because of the thickness of the layers of the semiconductor devices, a gap may separate each of the plurality of contact pads from each portion of the plurality of leads which bridge the plurality of apertures.

In order to facilitate contact of the leads to their respective contact pads, the castellated nozzle is aligned and mated with the flexible circuit carrier so that each of the contact surfaces of the castellations contacts a respective portion of each of the plurality of leads which bridge the plurality of apertures. Once proper alignment is achieved, the castellated nozzle may be forced in a direction so as to displace the leads so that they contact their respective contact pads.

The castellated nozzle may include a hole to facilitate alignment and mating of the castellated nozzle to the flexible film carrier. Typically, the hole has a longitudinal axis that passes through the castellated nozzle body in a direction parallel to the inner walls of the opening. The flexible circuit carrier and substrate may have similar holes formed therethrough. A pin may then be inserted through these holes for alignment and mating.

Typically, a hot air thermode (HAT) tool will be placed in close proximity to the bottom of the castellated nozzle so that a hot gas can be introduced into the opening extending through the body of the castellated nozzle for melting the solid solder on the contact pads. Preferably, the gas comprises nitrogen. As the gas travels through the opening it will flow into the channels of the nozzle, thereby creating eddies in the contact pads and exposing fresh solder for forming solder joints.

Preferably, the flexible circuit carrier is comprised of polyimide. The substrate may be a printed circuit board.

In one embodiment of the present invention, the castellated nozzle includes a first plurality of castellations forming a first row thereof, each of the first plurality of castellations having a contact surface thereon, a first plurality of channels formed adjacent to at least one castellation of the first row, a second plurality of castellations forming a second row thereof, each of the second plurality of castellations having a contact surface thereon, and a second plurality of channels each of which is formed adjacent to at least one castellation of the second row. An opening is formed between the first row and the second row. Preferably, the first and second plurality of castellations are arranged in a staggered format, wherein at a first point along the length of the opening, one of the castellations in the first row is located opposite to one of the channels in the second row. In addition, at a second point along the length of the opening, one of the channels in the first row is located opposite to one of the castellations in the second row. The castellated nozzle may also include a means for aligning the plurality castellations to a respective plurality of leads. The means for aligning the castellated nozzle preferably comprises one or more holes positioned between the first and second rows for receiving a pin to secure and align the flexible circuit carrier to the castellated nozzle.

It is therefore a primary object of the present invention to enhance the art of electronic packaging.

It is another object of the present invention to reduce costs associated with connecting a large plurality of conductive leads to a like plurality of contact pads.

It is yet another object of the present invention to provide an apparatus for connecting a large plurality of microelectronic conductive leads to an equal number of contact pads, without the need for a sophisticated alignment system.

It is still another object of the present invention to provide a castellated nozzle for connecting a plurality of microelectronic leads to a plurality of contact pads which provides better electrical connections by less costly assembly methods.

It is another object of the present invention to provide an apparatus for connecting a plurality of conductive leads to a like plurality of contact pads by fluxless solder bonding.

It is a further object of the present invention to provide an apparatus which can displace a plurality of microelectronic conductive leads into contact with a respective number of contact locations so that the leads can be solder bonded to their respective contact pads.

BRIEF DESCRIPTION OF THE DRAWINGS

The subject matter which is regarded as the present invention is particularly pointed out and distinctly claimed in the concluding portion of the specification. The invention, however, both as to organization and method of practice, together with the further objects and advantages thereof, may be best understood by reference to the following detailed description taken in conjunction with the accompanying drawings in which:

FIG. 2 is a top view of the castellated nozzle of FIG. 1.

FIG. 3 is a front elevational view of the castellated nozzle of FIGS. 1–2.

FIG. 4 is a side elevational view of the castellated nozzle of FIGS. 1–3 having an alignment pin of the present invention positioned above the castellated nozzle.

FIG. 5 is a partially cut-away and blown-up top view of a flexible circuit carrier of the present invention, having conductive leads bridging apertures formed on the flexible circuit carrier.

FIG. 6 is a partially cut-away and blown-up top view of the flexible circuit carrier of FIG. 5 overlying a semiconductor substrate having a plurality of contact pads formed thereon, wherein the contact pads are aligned underneath respective apertures of the flexible circuit carrier.

DETAILED DESCRIPTION OF THE PREFERRED EMBODIMENTS

It will be readily apparent that the components of the present invention, as generally described and illustrated in the figures, could be arranged and designed in a wide variety of different configurations. Thus, the following detailed description of the presently preferred embodiments of the castellated nozzle of the present invention, as represented in FIGS. 1–11, is not intended to limit the scope of the invention, as claimed, but is merely representative of the presently preferred embodiments of the invention. The presently preferred embodiments of the invention will be best understood by reference to the drawings, where like parts are designated with like numerals.

Figure 1:
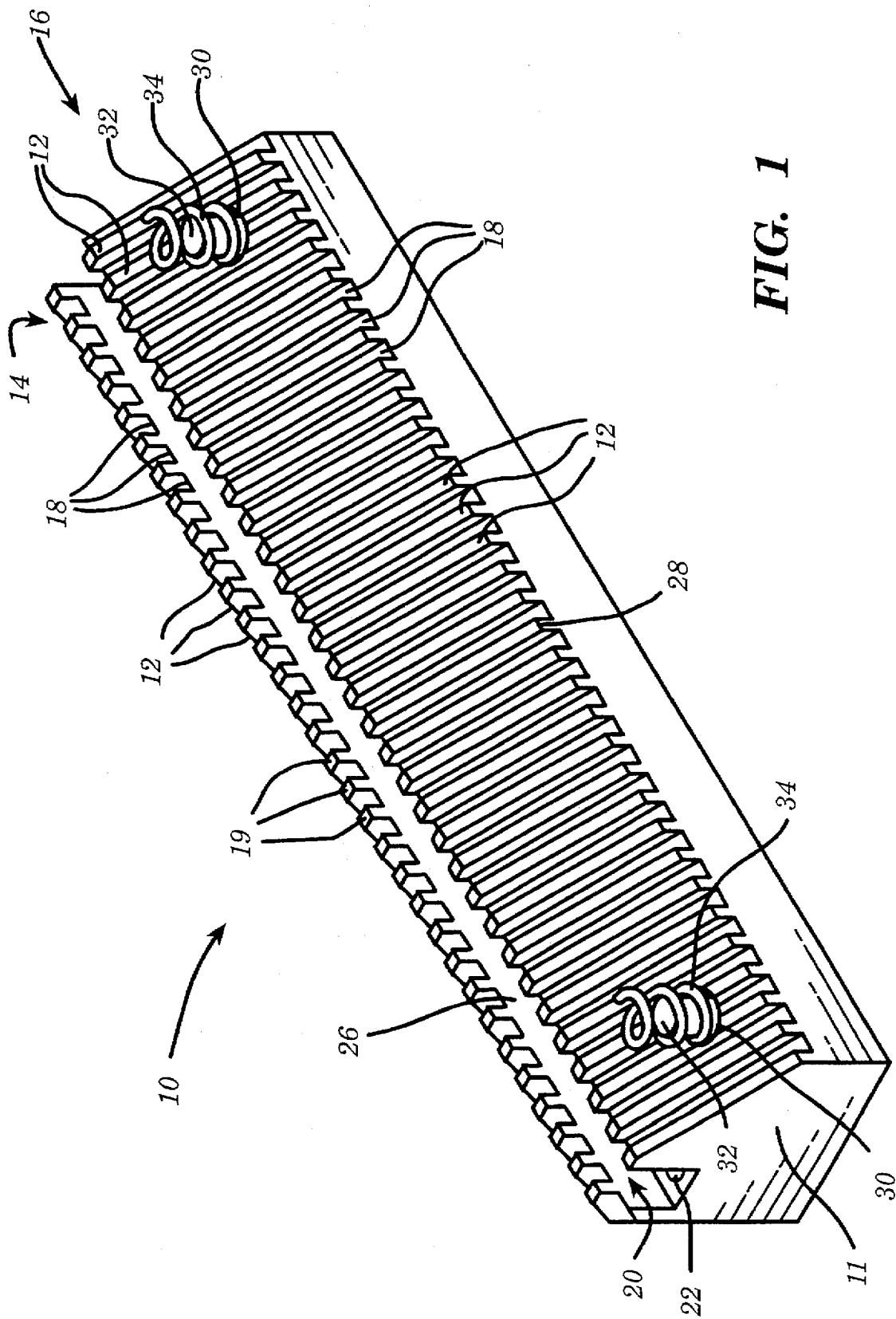
FIG. 1 is a isometric view of a castellated nozzle in accordance with the principles of the present invention.

In reference to the drawings, and more particularly to FIG. 1, there is shown in accordance with the present invention, a castellated nozzle 10. Castellated nozzle 10 may have a body 11, which includes a first row 14 and a second row 16 of castellations 12. Castellations 12 adjacent to one another may each have a channel 18 formed therebetween so as to create a first row 14 and a second row 16 of channels 18. An elongate opening 20 may extend through body 11 of castellated nozzle 10, separating first row 14 from second row 16. Castellated nozzle 10 may include a means 22 for aligning castellated nozzle 10 to a microelectronic packaging structure or substrate, the details of which will be described more thoroughly hereinafter.

As can be seen in FIG. 1, the body 11 of castellated nozzle 10 preferably resembles the shape of a house. First row 14 and second row 16 of castellations 12 and channels 18, for instance, take on an angled or sloped configuration like the roof of a house. Therefore, each castellation 12 may extend downward in a sloped configuration from a contact surface 19 to an outer wall 28. Each channel 18 may also take the same sloped configuration. While the length of each castellation in first row 14 is less than the length of each castellation in second row 16, it should be understood that the respective lengths of rows 14 and 16 is not intended to be in any way limiting.

As shown best in FIG. 1, each castellation 12 can have a contact surface 19 at the uppermost surface of castellated nozzle 10. Each castellation 12 may represent an elevated section on the body of the castellated nozzle 10. Preferably, contact surface 19 is flat and substantially square or rectangular in shape. Contact surface 19 may include an outer edge formed thereon. As shown in FIG. 2, each of the plurality of castellations may form a planar surface 90 extending from the outer edge of contact surface 19 to outer wall 28 of the castellated nozzle body. The contact surface 90 may intersect the planar surface 90 at the outer edge of each of the plurality of castellations. Contact surface 19 can lie in a plane perpendicular to an inner wall 26 of opening 20. Typically, each contact surface 19 may have the dimensions 0.010 by 0.010 inches. Each contact surface 19 may be employed to make contact with a conductive lead of an electronic device, the details of which will be described more fully hereinafter.

The first row 14 and second row 16 of castellations 12 are preferably arranged in a staggered format so that at a point along the length of elongate opening 20 a castellation 12 from first row 14 is located on one side of opening 20 and at the same point along the length of opening 20 a respective channel 18 from second row 16 is located on the opposite side of opening 20. Thus, each castellation 12 in first row 14 is aligned directly across from a respective channel 18 in second row 16 on the opposite side of elongate opening 20, and vice versa. As such, each castellation 12 of first row 14 may be diagonal to at least one channel 18 of second row 16.

While a definite number of castellations 12 is depicted in the accompanying drawings, it should be understood that the number depicted is not limiting. Therefore, it is intended that the number of castellations 12 selected for castellated nozzle 10 be dependent upon the number of solder joints to be effected in a microelectronic package, i.e., the number of solder joints between conductive leads and associated contact pads between two semiconductor devices.

Figure 8:
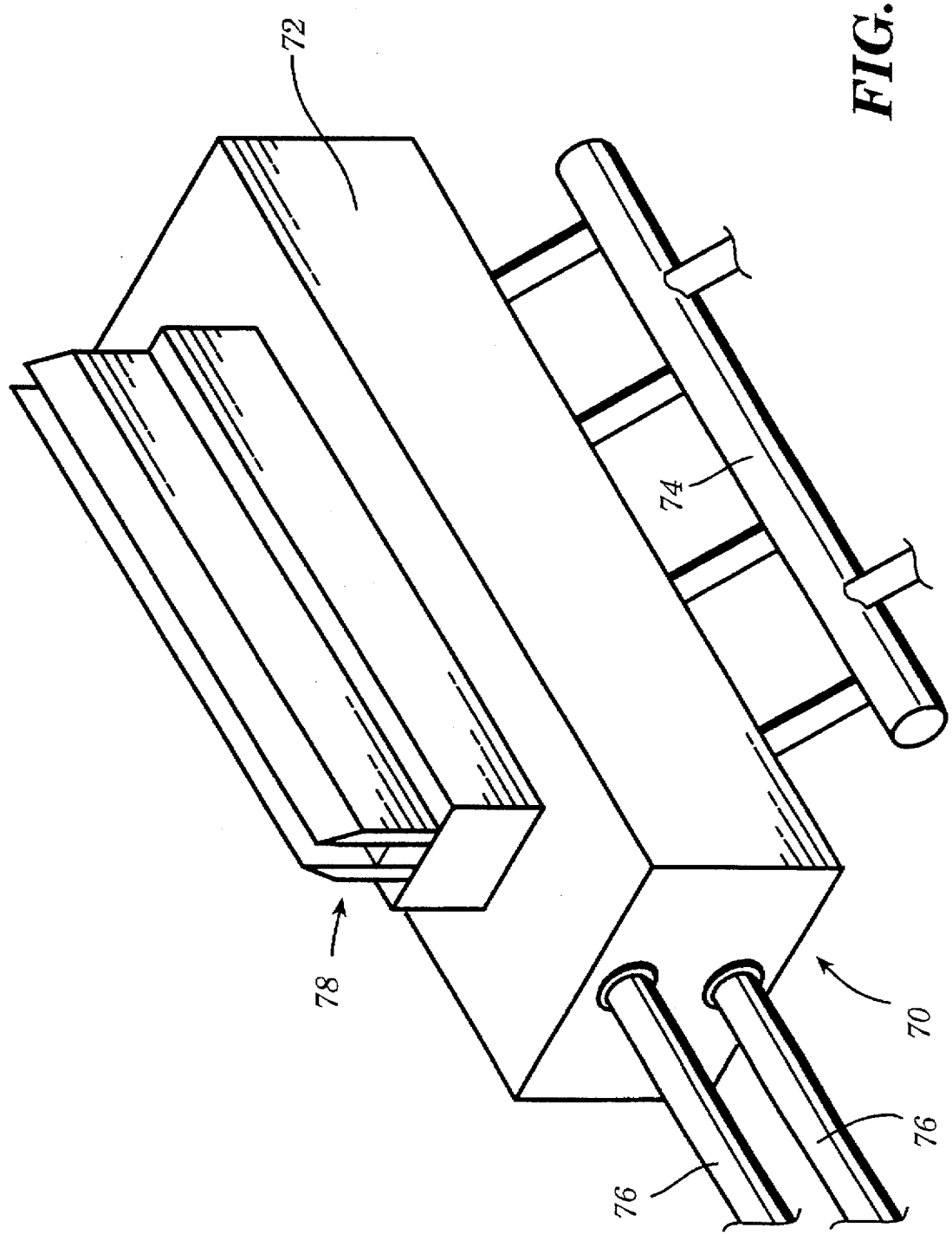
FIG. 8 is a isometric view of a hot air thermode (HAT) tool employed in accordance with the principles of the present invention for soldering a plurality of conductive leads to their respective contact pads.

Preferably, opening 20 of castellated nozzle 10 extends substantially lengthwise through body 11 of nozzle 10. The interior of castellated nozzle 10 therefore resembles a void. Inner walls 26 structurally define elongate opening 20. As shown in FIG. 1, inner walls 26 may be parallel to one another and perpendicular to contact surfaces 19. Inner walls 26 may form an inner edge for the castellations and channels. Each channel 18 may have a channel surface 92 (FIG. 3) extending from its inner edge of inner walls 26 to outer wall 28 of the castellated nozzle body. Each channel surface 92 may be in a plane parallel to the planar surfaces 90 of each castellation 12 in the respective row. Each channel surface 92 may be formed perpendicular to the walls of adjacent castellations 12. Opening 20 opens at the bottom of castellated nozzle 10 and provides a thoroughfare for a gas to enter. Therefore, opening 20 may pass through the body of castellated nozzle 10, forming a bottom open end and a top open end. The top open end can be proximate to the contact surfaces 19 of the plurality of castellations 12. Operationally, after gas enters from the bottom open end of castellated nozzle 10, it may travel through opening 20 and be dispersed into the plurality of channels 18 which separate adjacent castellations 12. A hot air thermode (HAT) tool may be employed to introduce the gas to castellated nozzle 10 (FIG. 8).

FIG. 2 depicts castellated nozzle 10 from the top view. As can be seen from FIG. 2, each castellation 12 of first row 14 can extend a length less than each castellation 12 of second row 16. A support plate 21 may be anchored in opening 20 so as to improve the structural integrity of castellated nozzle 10. Means 22 for aligning the castellated nozzle 10 to a semiconductor packaging structure or other semiconductor substrate may comprise a hole 22 formed through body 11 of castellated nozzle 10. Hole 22 may be employed to accommodate an alignment pin 23 for aligning castellated nozzle 10 to a semiconductor surface or substrate (FIG. 4).

Castellated nozzle 10 may include a bore 30 which passes through body 11 of castellated nozzle 10. Preferably, there are two bores 30 extending through the second row 16 of castellations 12 and channels 18. Bores 30 may pass through the channel surface of channels 18 and the planar surface of castellations 12. As can be seen in FIG. 2, bores 30 may extend in a direction orthogonal to contact surface 19 and parallel to inner walls 26. Bores 30 may be threaded to accommodate a threaded bolt 32. A spring 34 may be mechanically secured to bolt 32. As shown in FIGS. 3–4, bolt 32 and spring 34 both may protrude out of body 11 of castellated nozzle 10. Spring 34 may be employed to facilitate the balancing of the castellated nozzle 10 on top of another semiconductor device, the details of which will be disclosed more fully hereinafter.

FIG. 2 depicts the staggered relationship of the castellations 12 in first row 14 to the castellations 12 in second row 16. For purposes of illustration, a line 15 has been drawn in FIG. 2 to show the relationship between a castellation 12 of second row 16 to a channel 18 of first row 14. As can be seen with line 15, each castellation 12 in second row 16 may be aligned directly across elongate opening 20, from a respective channel 18 of first row 14, and vice versa.

While castellated nozzle 10 may be fabricated from any suitable material, it is preferred that castellated nozzle 10 be made of a hard metal, such as 304 Stainless Steel, Inconel, and titanium. The castellated structure of nozzle 10 is preferably fabricated by a computer controlled metal fabrication process, such as a wire electro-discharge machining (EDM) method of manufacture.

FIG. 5 is a partially blown-up view, as seen from the top, of an interconnector, i.e., a flexible circuit carrier 40, made in accordance with the principles of the present invention. Flexible circuit carrier 40 is preferably fabricated of a flexible insulative layer 42, such as polyimide. A suitable material for insulative layer 42 is known under the tradename Kapton®. Typically, insulative layer 42 has a thickness of 2/1000th of an inch. By utilizing flexible circuit carrier 40 as the means for interconnecting a semiconductor chip packaging structure to a packaging substrate, better electrical connections may be achieved between two semiconductor devices. While polyimide or Kapton® is the preferred material for insulative layer 42 of flexible circuit carrier 40, other suitable insulator materials may be selected therefor, such as polyester.

A plurality of apertures 44 may be formed in insulative layer 42. As shown in FIG. 5, a first row 46 and second row 48 of apertures 44 may be formed in layer 42. First and second rows 46, 48 of apertures 44 resemble a series of "windows" on flexible circuit carrier 40. Any known semiconductor processing technique may be utilized to form apertures 44 in layer 42, such as a known chemical photo-processing method.

First row 46 and second row 48 of apertures 44 preferably are in a staggered format in a like fashion to castellations 12 of castellated nozzle 10 so as to facilitate alignment of each castellation 12 to a respective aperture 44. Therefore, each aperture 44 in first row 46 is preferably diagonal to at least one aperture in second row 48. Preferably, each aperture 44 is bridged by an associated conductive lead 49. Each conductive lead 49 may therefore be suspended over an associated aperture 44. Each conductive lead 49 may be copper plated or another suitable conductive metal. The portion of each lead 49 which bridges aperture 44 may be coated with a solder wettable material, such as gold. While gold is preferred in forming a solder wettable surface without using flux on the bridged portions of conductive leads 49, other suitable materials may be chosen, for example, nickel and tin. Typically, each conductive lead 49 may be about 4/1000th of an inch wide and 1/1000th of an inch in depth.

Flexible circuit carrier 40 includes an alignment means 50 so as to facilitate alignment and proper mating of carrier 40 to a semiconductor substrate, such as a printed circuit board. Alignment means 50 may also be employed to align castellated nozzle 10 to the flexible circuit carrier 40. Alignment means 50 may include a hole 50, which is formed during fabrication of the plurality of apertures 44. By forming hole 50 during fabrication of apertures 44, alignment means 50 can be formed precisely in relation to apertures 44 and conductive leads 49. Therefore, sophisticated alignment systems, such as split optics, are not necessary for aligning and properly mating flexible circuit carrier 40 to a semiconductor packaging substrate and to castellated nozzle 10.

Figure 10:
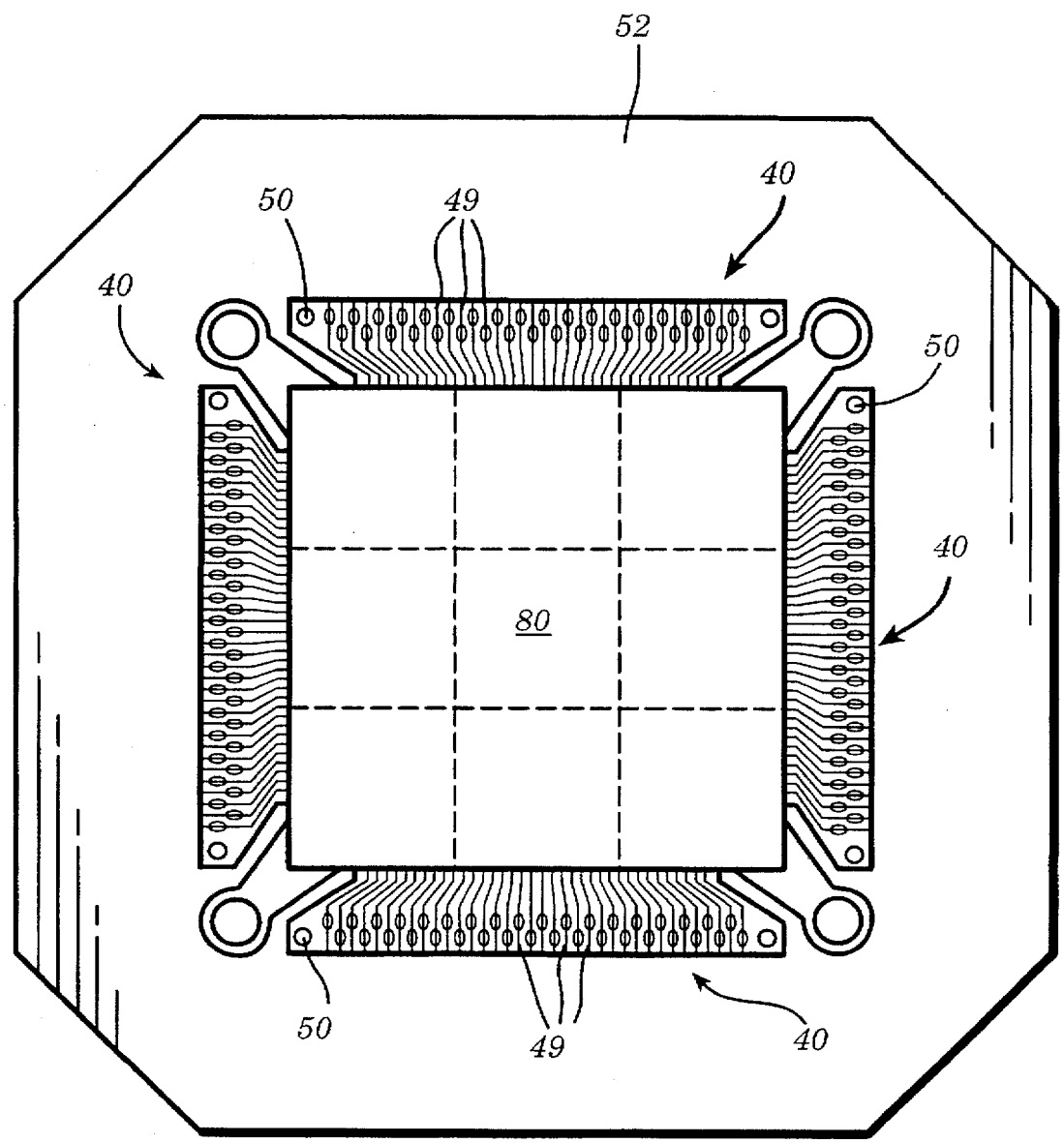
FIG. 10 is a top view of a multi-chip module attached to a printed circuit board through the provision of four flexible circuit carriers in accordance with the principles of the present invention.
Figure 11:
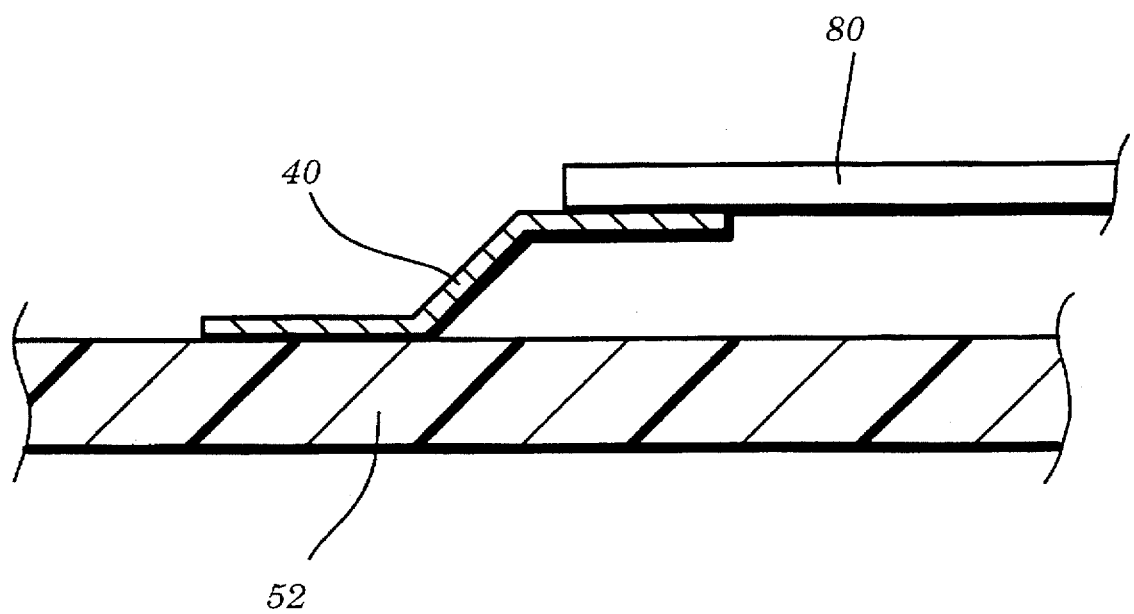
FIG. 11 is a side elevational view of a flexible circuit carrier interconnecting a printed circuit board and multi-chip module.

The present invention may be applied to tape automated bonding (TAB) technology. In TAB technology, a spaced plurality of leads, such as conductive leads 49, are fabricated on an elongated flexible carrier film, such as flexible circuit carrier 40, which can then be wound onto and unwound from reels for automated fabrication of electronic components. Each lead has an inner lead bond (ILB) end and an outer lead bond (OLB) end. Therefore, the conductive leads 49 formed on the flexible circuit carrier 44 may project inwardly where they extend over the edge of the carrier film in a cantilevered fashion to form ILB ends. These inner conductive leads can thus be electrically connected to contact pads on a semiconductor chip packaging structure, such as a multi-chip module (MCM) (FIG. 10). The outer conductive leads extend outward over their respective apertures 44 in the carrier 40, thereby forming OLB ends. These outer conductive leads can thus be electrically connected to contact pads on a semiconductor packaging substrate, such as a printed circuit board (FIG. 10). The flexible circuit carrier 44 may be punched out by a die to take a specific configuration. One configuration for flexible circuit carrier 44 is a Z-shape, as shown in FIG. 11.

Figure 7:
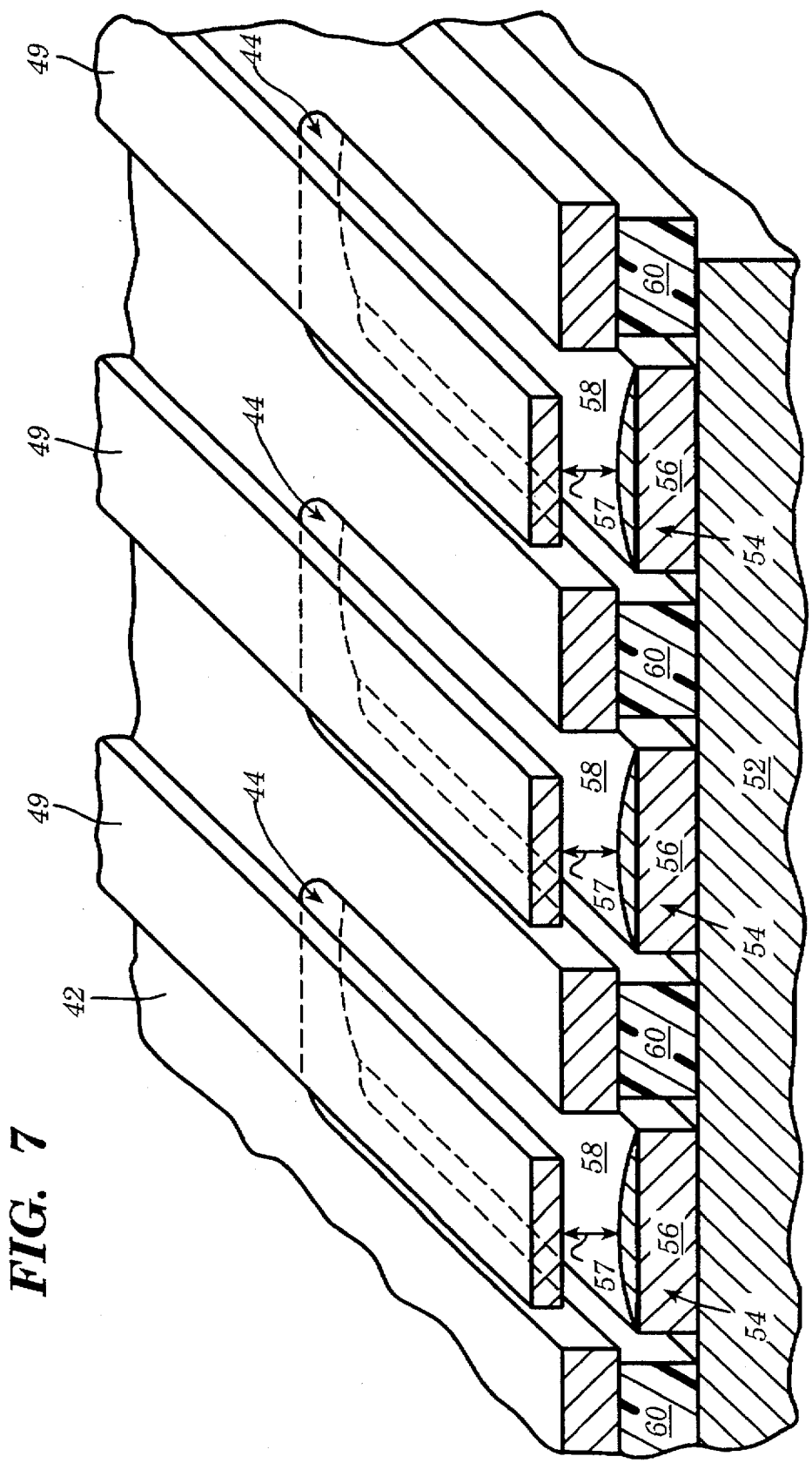
FIG. 7 is a partially cut-away and blown-up sectional isometric view of the flexible circuit carrier of FIG. 6, showing the conductive leads formed over the apertures of the flexible circuit carrier and contact pads formed on top of a semiconductor substrate.

FIG. 6 depicts flexible circuit carrier 40 properly positioned atop a semiconductor packaging substrate 52, such as a printed circuit board. Substrate 52 includes a series of contact pads 54 deposited thereon. Contact pads 54 are deposited on substrate 52 in the same staggered format as apertures 44 of flexible circuit carrier 40 and castellations 12 of castellated nozzle 10. Each contact pad 54 may comprise a copper land 56, topped by a solder coating 58 (FIG. 7). Each contact pad 54 is applied to substrate 52 by using techniques well-known in the art. Each contact pad 54 preferably comprises the configuration as shown in FIG. 7, having an oval shape and a dome-shaped upper portion. It should be understood however that the present invention is not limited to such a configuration, and numerous other configurations may be appropriate.

Semiconductor packaging substrate 52 preferably includes a hole 54, which can be aligned with hole 50 of flexible circuit carrier 42. Alignment pin 23 described above may be passed through holes 50 and 54 so that flexible circuit carrier 40 and packaging substrate 52 may be properly aligned to one another. Alignment of flexible circuit carrier 40 to substrate 52 involves alignment of the two semiconductor devices so that each contact pad 54 is properly situated under a respective aperture 44 or "window". Proper alignment of carrier 40 and substrate 52 may be achieved when each aperture 44 of carrier 40 is positioned so that a respective contact pad 54 is disposed underneath and proximate to aperture 44. Preferably, each aperture 44 should be superimposed over its respective contact pad 54. A fixture (not shown) may also be positioned underneath substrate 52, which may also include a hole (not shown) for alignment pin 23 to pass through.

FIG. 7 is a sectional isometric view, taken along line A—A of FIG. 6, where conductive leads 49 can be seen cantilevered over respective apertures 44 of flexible circuit carrier 40. Underneath flexible circuit carrier 40 is substrate 52 having a plurality of contact pads 54 deposited thereon. Preferably, a solder dam, or a solder mask 60 is formed on substrate 52, and separates adjacent contact pads 54. Solder mask 60 may be applied to substrate 52 so as to prevent melted solder from running or migrating. In order to prevent melted solder from migrating onto other leads on substrate 52, the thickness of solder mask 60 is preferably greater than the thickness of contact pad 54, as can be seen in FIG. 7. Because the combined thickness of solder mask 60 and insulative layer 42 is greater than the thickness of contact pad 54, a gap 57 may separate each conductive lead 49 from its respective contact pad 54. Therefore, in order to make contact of each lead 49 to its associated contact pad 54 for forming a solder joint, displacement of each of lead 49 is necessary. At a minimum, each lead 49 must be displaced the distance represented by gap 57 so as to achieve the necessary contact for forming the solder joints.

Once flexible circuit carrier 40 is properly aligned to substrate 52 so that mounds 54 are situated under apertures 44, castellated nozzle 10 may be employed to force each lead 49 to make contact with its respective contact pad 54. In order to properly align castellated nozzle 10 to flexible circuit carrier 40, alignment pin 23 as described above may be employed. Springs 34, which protrude body 11 of castellated nozzle 10, provide a means for balancing nozzle 10 atop of flexible circuit carrier 40 so as to prevent castellated nozzle 10 from tipping over during operation.

While a staggered format is preferred for the castellations 12 and channels 18 of castellated nozzle 10, it should be understood that numerous other configurations are acceptable, so long as the configuration chosen for castellated nozzle 10 is identical to the configuration chosen for the apertures of flexible circuit carrier 40 and the contact pads 54 of substrate 52.

FIG. 8 depicts a hot air thermode (HAT) tool 70 for supplying a superheated gas for solder bonding the leads to contact pads, as described hereinabove. HAT tool 70 includes a body 72, a gas manifold 74, one or more heating elements 76, and a nozzle head 78. The gas should be sufficiently heated to melt the solid solder coating 58 and have sufficient momentum to disperse the surface oxide formed on the molten solder. Gas manifold 74 can supply a steady flow of gas into the body 72 of HAT tool 70. The gas is heated by raising the body temperature of body 72 by passing more current through heating elements 76 and thereafter forcing the gas at a high velocity through nozzle head 78. Preferably, nitrogen gas is selected to melt the solid solder. However, it is understood that numerous other gases may also be substituted therefor. For example, compressed air may be employed.

As already described, HAT tool 70 may be employed to supply hot gas for melting solder coating 58 so that each lead 49 may be soldered to its respective contact pad 54. Further detail concerning the melting of solder coating 58 through the provision of the HAT tool used in accordance with the principles of the present invention, and, as described herein, may be found in U.S. Pat. No. 4,937,006, entitled "Method and Apparatus for Fluxless Solder Bonding", which is hereby incorporated by reference in its entirety.

The apparatus and method as described herein permits the fluxless solder bonding of conductive leads to associated contact pads. Instead of utilizing flux to break up the oxide film formed on the solder coatings 54, the oxide film may be broken as eddies are created as a result of the high momentum of the gas passing over the solder coatings 54. Once fresh solder is available to gold plated copper leads 49, metallurgical contact may be instantly made.

Operationally, flexible circuit carrier 40 of the present invention can be simply aligned to semiconductor packaging substrate 52 without the need for a sophisticated vision system. Mechanical alignment and attachment may be secured through interference fits and slip fits between pin 23 and alignment holes 50 and 54 of flexible circuit carrier 42 and substrate 52, respectively. The same interference and slip fits are used to align castellated nozzle 10 to the two semiconductor surfaces. Alignment of the two semiconductor devices may be achieved by inserting alignment pin 23 through hole 50 of flexible circuit carrier 40 and through hole 54 of substrate 52. Because apertures 44 of flexible circuit carrier 40 are staggered in the same format as contact pads 54, each aperture 44 should be properly aligned above a respective contact pad 54 and preferably superimposed over each aperture 44. Once flexible circuit carrier 40 is properly aligned above substrate 52, portions of leads 49 which are bridged over apertures 44 are also bridged over associated contact pads 54. Gap 57 (FIG. 7), however, separates leads 49 from contact pads 54.

In order to achieve contact of the portion of each of leads 49 which bridge or suspend respective apertures 44 with associated contact pads 54, castellated nozzle 10 of the present invention may be employed and can be aligned on top of flexible circuit carrier 40. The staggered format of castellations 12 permits proper alignment and superimposition of each castellation 12 with each aperture 44 and underlying contact pad 54. In order to facilitate alignment of castellated nozzle 10 to flexible circuit carrier 40 and substrate 52, alignment pin 23 may be inserted into alignment means 22 of castellated nozzle 10. Springs 34 protruding from the second row 16 of castellations 12 and channels 18 may be employed to balance castellated nozzle 10 on top of flexible circuit carrier 40, thereby preventing nozzle 10 from tipping over. Once alignment has been achieved, castellated nozzle 10 may be forced in a direction so that each individual lead 49 is displaced into contact with a respective contact pad 54. Typically, 100 grams of force may be applied to effect contact. In order to melt each solder coating 58, nozzle head 78 of HAT tool 70 may be brought into close proximity to the bottom of castellated nozzle 10 so that a gas may be injected into the bottom of opening 20 of castellated nozzle 10. HAT tool 70 and opening 20 insures a uniform laminar flow of gas through opening 20 and into each channel 18. Even though each lead 49 is in contact with a respective contact pad 54, the channels 18 facilitate the escape of gas therethrough. Each channel 18 therefore acts like a chimney. Channels 18 provide uniform temperature distribution of the gas at each solder location.

The high velocity gas can melt the solder coating 58 so as to facilitate solder bonding of each lead 49 of flexible circuit carrier 40 to respective contact pads 54 of substrate 52. The gas passes through opening 20 and through channels 18 of castellated nozzle 10. As the gas passes through the channels, the solder coating 58 melts, and eddies in the solder coating 58 are created, further facilitating solder bonding of the leads 49 to the contact pads 54. Once the solder coating 58 is melted and the surface oxide dispersed, the molten solder wets the solder wettable surface on leads 49. The leads 49 are then cooled to form the joint structure as shown in FIG. 9.

Figure 9:
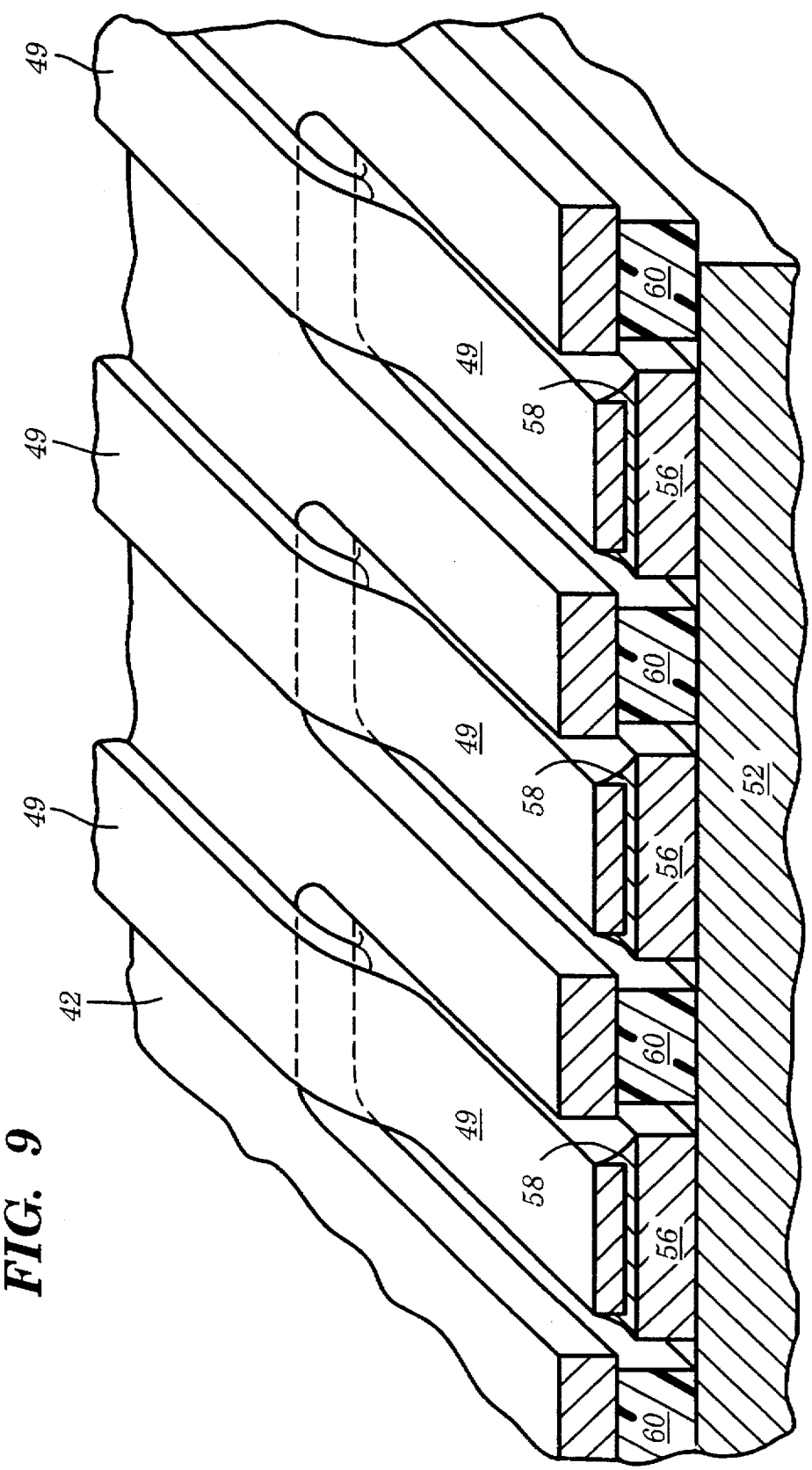
FIG. 9 is a partially cut-away and blown-up view of the resultant connection of the flexible circuit carrier and the substrate of FIGS. 6–7 made in accordance with the principles of the present invention.

FIG. 9 depicts, in cross-section, and blown-up, a partial view of the resultant joint which may be achieved by the apparatus and method as described herein. As can be seen in FIG. 9, the leads 49 have been vertically displaced by the castellations 12 of castellated nozzle 10.

FIG. 10 shows a semiconductor chip packaging structure, such as a multi-chip module 80, interconnected to a semiconductor packaging substrate, such as printed circuit board 52. Four flexible circuit carriers 40 of the present invention have been employed to achieve connection of the two semiconductor devices.

FIG. 11 depicts from the side, the multichip module 80 connected to the printed circuit board 52 through the flexible circuit carrier 40 of the present invention, showing the Z-shape configuration of flexible circuit carrier 42.

While several aspects of the present invention have been described and depicted herein, alternative aspects may be effected by those skilled in the art to accomplish the same objectives. For example, the exact configuration of the castellations of the castellated nozzle of the present invention may be modified depending upon the configuration and size of contact pads and the apertures of the two semiconductor devices desired to be connected. Accordingly, it is intended by the appended claims to cover all such alternative aspects as fall within the true spirit and scope of the invention.

What is claimed:

1. A castellated nozzle for connecting a plurality of leads to a plurality of contact pads, comprising:

a body having a plurality of castellations protruding therefrom, each of said castellations having a contact surface thereon;

a plurality of channels, each of said plurality of channels being formed adjacent to at least one castellation of said plurality of castellations;

an opening extending through said body for introducing a gas therein; and means for aligning said contact surfaces of said plurality of castellations to a respective plurality of leads.

2. The castellated nozzle of claim 1 further comprising a first row of castellations and channels and a second row of castellations and channels, said opening separating said first row from said second row.

3. The castellated nozzle of claim 2, wherein said opening defines a first inner wall opposing a second inner wall, wherein said first and second inner walls are substantially parallel to one another.

4. The castellated nozzle of claim 2, wherein said opening has a bottom open end and a top open end, said top open end being proximate to said contact surfaces of said plurality of castellations.

5. The castellated nozzle of claim 3, wherein said first inner wall forms an inner edge of said first row of castellations and channels and said second inner wall forms an inner edge of said second row of castellations and channels.

6. The castellated nozzle of claim 5, wherein said first inner wall is formed at substantially a ninety-degree angle to said contact surfaces of said first row of castellations and said second inner wall is formed at substantially a ninety-degree angle to said contact surfaces of said second row of castellations.

7. The castellated nozzle of claim 5, wherein each of said contact surfaces has an outer edge formed thereon.

8. The castellated nozzle of claim 7, wherein each of said plurality of castellations forms a planar surface extending from the outer edge of said contact surface to an outer wall of said castellated nozzle body.

9. The castellated nozzle of claim 8, wherein said contact surface intersects said planar surface at said outer edge of each of said plurality of castellations.

10. The castellated nozzle of claim 5, wherein each of said plurality of channels in said first row forms a first channel surface extending from said inner edge of said first inner wall to said outer wall of said castellated nozzle body, and each of said plurality of channels in said second row forms a second channel surface extending from said inner edge of said second inner wall to said outer wall of said castellated nozzle body.

11. The castellated nozzle of claim 1, wherein said means for aligning comprises a hole formed through said castellated nozzle body.

12. The castellated nozzle of claim 11, wherein said hole has a longitudinal axis that passes through said castellated nozzle body in a direction substantially parallel to said inner wall of said opening.

13. The castellated nozzle of claim 12, further comprising an alignment pin for insertion into said hole.

14. The castellated nozzle of claim 13, further comprising means for balancing said castellated nozzle so that each of said contact surfaces rests evenly on a respective lead.

15. The castellated nozzle of claim 14, wherein said means for balancing said castellated nozzle comprises a spring attached to said castellated nozzle body, said spring having a longitudinal axis disposed parallel to said inner wall.

16. The castellated nozzle of claim 15, wherein said spring is inserted into a bore passing through said planar surface and said channel surface.

17. A castellated nozzle for connecting a plurality of leads to a plurality of contact pads, comprising:

a first plurality of castellations forming a first row thereof, each of said first plurality of castellations having a contact surface thereon;

a first plurality of channels formed adjacent to at least one castellation of said first row;

a second plurality of castellations forming a second row thereof, each of said second plurality of castellations having a contact surface thereon;

a second plurality of channels formed adjacent to at least one castellation of said second row;

an opening formed between said first row and said second row, said opening having a length;

said first and second plurality of castellations being arranged in a staggered format wherein at a first point along the length of the opening one of said castellations in said first row is located opposite to one of said channels in said second row, and wherein at a second point along the length of the opening one of said channels in said first row is located opposite to one of said castellations in said second row; and means for aligning said plurality of castellations to a respective plurality of leads.

18. The castellated nozzle of claim 17, wherein said means for aligning said castellated nozzle comprises a hole positioned between said first and second rows for receiving a pin to secure and align said flexible circuit carrier to said nozzle.

19. The castellated nozzle of claim 18, further comprising a pin for insertion into said hole.

20. The castellated nozzle of claim 17, wherein said opening is elongate and separates said first and second rows of castellations, said opening having a bottom open end and a top open end.

21. The castellated nozzle of claim 20, further comprising a hot air thermode tool for introducing a gas into the bottom open end of said opening.

* * * * *